(12) United States Patent
Kageyama

(10) Patent No.: US 6,670,547 B2
(45) Date of Patent: Dec. 30, 2003

(54) MAGNETICALLY SHIELDED ENCLOSURES AND ASSOCIATED METHODS FOR PROTECTING A FIELD-SENSITIVE SYSTEM FROM STRAY EXTERNAL MAGNETIC FIELDS

(75) Inventor: Motofusa Kageyama, Kanagawan-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/269,440

(22) Filed: Oct. 11, 2002

(65) Prior Publication Data

US 2003/0070828 A1 Apr. 17, 2003

(30) Foreign Application Priority Data

Oct. 15, 2001 (JP) ......................................... 2001-316230

(51) Int. Cl.$^7$ ................................................. H05K 9/00
(52) U.S. Cl. ............................... 174/35 R; 179/35 MS; 361/816
(58) Field of Search ......................... 174/35 R, 35 MS; 361/799, 800, 816, 818; 428/615, 617, 619, 678, 679

(56) References Cited

U.S. PATENT DOCUMENTS

| | | | | |
|---|---|---|---|---|
| 4,608,453 A | * | 8/1986 | Freeman | 174/35 MS |
| 4,959,504 A | * | 9/1990 | Yarger et al. | 174/35 MS |
| 5,698,818 A | * | 12/1997 | Brench | 174/35 R |
| 5,847,316 A | * | 12/1998 | Takada | 174/35 MS |

OTHER PUBLICATIONS

U.S. patent application Ser. No. 10/002,908, Suzuki et al., filed Nov. 13, 2001.
U.S. patent application Ser. No. 10/131,805, Kageyama, filed Apr. 22, 2002.

* cited by examiner

Primary Examiner—Anthony Dinkins
Assistant Examiner—Carmelo Oliva
(74) Attorney, Agent, or Firm—Klarquist Sparkman LLP (57) ABSTRACT

Magnetically shielded enclosures (e.g., rooms) and associated methods are disclosed for containing and magnetically shielding a field-sensitive system such as a charged-particle-beam (CPB) microlithography system without having to make the enclosure excessively large. The CPB microlithography system includes a lens column and substrate chamber collectively forming an internal shielding barrier. The shielded enclosure is in external surrounding relationship to the internal shielding barrier. The shielded enclosure includes a wall that defines an aperture through which some of the stray external magnetic field can penetrate to inside the enclosure. Some of the external magnetic field also leaks through the enclosure walls. The aperture is situated and configured such that the external magnetic flux leaking through the aperture (which flux tending to be directed toward the enclosure walls) and other external magnetic flux leaking through the enclosure walls (which flux tending to be directed toward the internal shielding barrier) at least partially cancel each other. This cancellation reduces the amount of the leakage flux that penetrates the internal shielding barrier to the field-sensitive system inside the barrier.

26 Claims, 5 Drawing Sheets

MAGNETICALLY SHIELDED ENCLOSURES AND ASSOCIATED METHODS FOR PROTECTING A FIELD-SENSITIVE SYSTEM FROM STRAY EXTERNAL MAGNETIC FIELDS

FIELD

This disclosure pertains to magnetic shielding of an enclosure such as a room containing equipment that is sensitive to the effects of external magnetic fields, and to enclosures shielded in such a manner. Exemplary field-sensitive systems that can be contained in such a magnetically shielded enclosure include systems for performing microlithography using a charged particle beam.

BACKGROUND

The growth of modern processing and analytical technology has included more extensive use of techniques that employ a charged particle beam (e.g., electron beam or ion beam). Accompanying more extensive use of these techniques generally has been a demand for progressively more accurate and precise performance from the systems that perform the techniques. For example, increasingly greater image resolution is being demanded from electron microscopy. Also, increasingly greater pattern-transfer resolution and accuracy is being demanded from charged-particle-beam (CPB) microlithography, which is a key "next-generation lithography" technology being actively developed for fabricating microelectronic devices.

Obtaining greater pattern-transfer accuracy from a CPB microlithography system requires application of more stringent measures to prevent the charged particle beam from being influenced uncontrollably by stray external and internal magnetic and electrical fields. External stray magnetic fields include magnetic fields produced by the earth, events in outer space, and by nearby man-made equipment such as power equipment, power cables, and elevators, for example. Similarly, external stray electrical fields can be produced by any of various sources, both natural and man-made. "Internal" stray fields usually are produced by components of the CPB microlithography system located, for example, inside the "lens column" (vacuum chamber that houses the CPB optical system) and/or inside the "substrate chamber" (vacuum chamber that houses the substrate stage and peripheral components). Even if the magnitude or fluctuation amplitude of a stray field is very small, the field nevertheless can cause an undesired change in the trajectory and/or position of the charged particle beam sufficient to destroy any prospect of achieving a desired accuracy and precision of pattern transfer. For example, if the charged particle beam is being used to transfer a pattern having linewidths of, e.g., 70 nm, the importance of reducing the effect of a stray magnetic and/or electrical field, even an extremely small-magnitude field, on the beam is readily appreciated.

As noted above, potentially troublesome fields can be electrical or magnetic, static or dynamic (fluctuating), strong or weak, man-made or natural, internal or external. An example of an internal field is a field generated by a component of the system, such as a stray magnetic field produced by an electron lens or deflector or by a reticle stage or substrate stage. An example of an external field is a field produced by the earth or by nearby industrial activity.

For shielding purposes, conventional CPB microlithography systems usually include one or more magnetic shields located inside the lens column and inside the substrate chamber. For example, shielding may be associated with certain peripheral components located in or near these chambers, such as wafer loaders, reticle loaders, electromagnetic lenses, stage motors, vacuum pumps, etc. Another conventional manner of shielding CPB microlithography lens columns and substrate chambers is the application to the chambers of a single, double, or triple coating of a material having a high initial magnetic permeability such as Permalloy. Alternatively or in addition, the lens columns and substrate chambers themselves are made of a material having high initial magnetic permeability, such as Permalloy.

Figure 6:
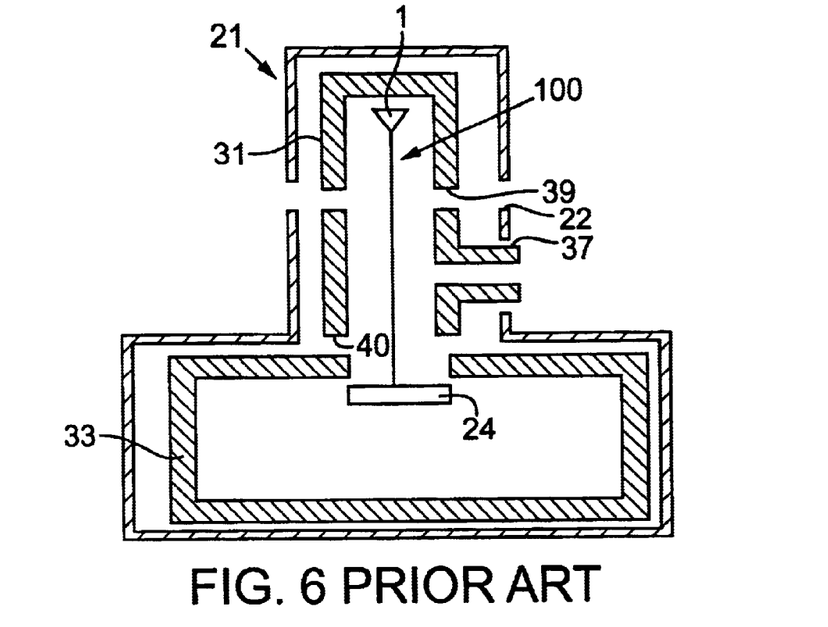
FIG. 6 is a schematic elevational section of the lens column and substrate chamber of a conventional CPB microlithography system, including conventional magnetic shielding situated externally of the lens column and substrate chamber.

Reference is made to FIG. 6 that schematically depicts exemplary conventional magnetic shielding used in association with a CPB microlithography system. The subject system 100 comprises an electron gun 1 that generates an electron beam that propagates in a downstream direction (downward in the figure). A substrate stage 24 includes a "wafer chuck" on which the lithographic substrate is mounted for exposure by the electron beam. The electron gun 1 and an electron-optical system (not detailed) extending along the trajectory of the electron beam are contained in a "lens column" 31, and the substrate stage 24 is contained in a substrate chamber 33. The lens column 31, typically made of invar or soft iron, is connected via a duct 37 to a vacuum pump (not shown). The substrate chamber 33 typically is made of aluminum or non-magnetic stainless steel. The lens column 31 and substrate chamber 33 are conjoined and thus communicate with each other, allowing their respective internal spaces to be shared. Although not detailed, the microlithography system 100 includes one or more condenser lenses that direct the electron beam onto a reticle, one or more beam-trimming apertures, a reticle stage, a projection-lens assembly that demagnifies and projects the electron beam (propagating downstream of the reticle) onto a lithographic substrate, and one or more beam deflectors for beam positioning and aberration correction.

The microlithography system 100 is enclosed within a shielded enclosure 21. The enclosure 21 is effectively a chamber made of a material having high initial magnetic permeability. The enclosure 21 houses the entire lens column 31 and substrate chamber 33 of the system 100.

The enclosure 21 defines various openings. For example, a vacuum duct 37 extends through the wall of the enclosure 21 to allow evacuation of the lens column 31 and substrate chamber 33. Other openings 22 in the enclosure 21 correspond with respective feed-through apertures 39 in the lens column 31 to allow passage of wires and the like to and from the lens column 31. Another opening (not shown) corresponds with a respective opening in the lens column 31 through which the reticle is moved to and from the reticle stage. Although not detailed in FIG. 6, yet another opening in the enclosure 21 allows passage of the lithographic substrate through a respective opening in the substrate chamber 33 through which the substrate is moved to and from the substrate stage 24. In addition, a gap 40 usually is associated with the location of a connecting member coupling the lens column 31 to the substrate chamber 33. Since the enclosure 21 typically is not unitary, other gaps in the enclosure 21 typically are provided at respective conjunctions of shield segments.

Openings and gaps in the magnetically permeable material of the enclosure 21 usually reduce the magnetic-shielding performance of the enclosure, sometimes to a level at which the shielding effect is inadequate. Consequently, an aperture or gap is provided in the enclosure usually only when necessary. To offset the consequences of providing apertures and gaps in the enclosure 21, it frequently is necessary to shield the walls of the room containing the enclosure 21 (with the CPB microlithography system 100 or other field-sensitive system inside). The shielded room can be "passively" shielded, wherein the room walls simply are covered with a magnetic-shielding material. Alternatively or in addition, the room can be "actively" shielded, wherein the room walls include respective coils that generate respective magnetic fields extending usually in a selected direction normal to the plane of the wall. The coil-containing walls typically are separated by a distance from the system enclosed in the room (e.g., separated from the lens column and substrate chamber). By appropriate energization of one or more of the coils, a portion of an external magnetic field leaking into the room is cancelled by a countervailing magnetic field generated from by the coil(s). This technique is termed "active cancellation," and the coils are termed "active cancellers."

Figure 7:
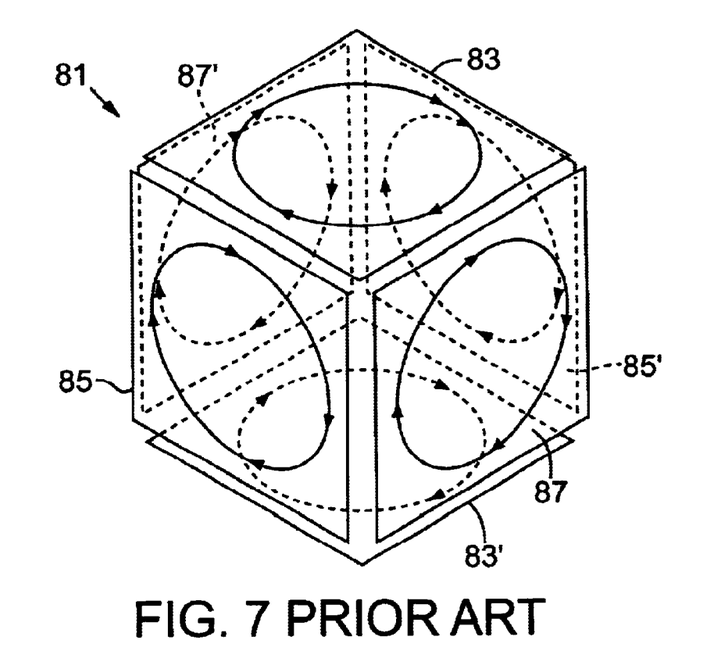
FIG. 7 is an isometric view schematically depicting a conventional magnetically shielded enclosure including respective active cancellers in each wall of the enclosure.

A conventional shielded room 81 including active cancellers is shown in FIG. 7, comprising three active cancellers each comprising a respective pair 83 and 83', 85 and 85', 87 and 87' of opposing coils collectively arranged three-dimensionally. The coils can be situated on the inside or outside of the walls of the room 81. The arrows associated with the coils in the figure denote the respective directions of electric currents that flow in the coils. As a result of such current flow in the respective coils, the three pairs 83 and 83', 85 and 85', 87 and 87' of coils generate respective magnetic fields in mutually perpendicular directions. The magnitude and direction of the electrical currents applied to respective pairs of coils can be adjusted as required to create, inside the room 81, a net magnetic field having a magnitude and direction that serve to cancel at least a portion of a stray external magnetic field penetrating into the room.

In a shielded room 81 configured as shown in FIG. 7, the best field-cancellation performance generally is obtained at or near the center of the room. As a result, despite energization of the active cancellers 83 and 83', 85 and 85', 87 and 87', some stray magnetic flux leaking into the room 81 from outside tends to remain not canceled inside the room, especially near the wall surfaces. If a portion of a field-sensitive system is situated near a wall under such a condition, the residual non-canceled magnetic flux leaking through the respective wall into the room 81 penetrates into the system and adversely affects system performance. Preventing this effect conventionally requires that the system be situated at the center of a room 81 that is many times larger than the system. If the system is large, then the room 81 must be extremely large, which may be impractical or impossible to construct from the standpoint of cost and/or ability of the site to accommodate such a large room. Also, the maximum size of a wall member made of a shielding material such as Permalloy is limited. When constructing a shielded room, the complexity of joints between walls and the processing required to configure such joints increase greatly with increased room size. Furthermore, in larger active cancellers, the increased size of the coils and of the equipment required to power them can be serious problems.

SUMMARY

In view of the shortcomings of the prior art as summarized above, the present invention provides, inter alia, magnetically shielded enclosures (e.g., rooms) and magnetic-shielding methods that produce a desired more complete shielding effect without having to make the enclosure prohibitively large. Also provided are magnetic-field-sensitive systems (e.g., charged-particle-beam lithography systems) enclosed in such enclosures.

According to a first aspect of the invention, magnetically shielded enclosures are provided for containing and magnetically shielding a field-sensitive system. (The field-sensitive system includes an internal shielding barrier substantially surrounding the system.) An embodiment of such an enclosure comprises multiple walls made of a material including a magnetically permeable material. The walls are configured relative to each other so as to define an internal magnetically shielded space that encloses the internal shielding barrier and thus the system. The enclosure embodiment also includes an aperture defined in at least one of the walls. The aperture is configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space. The cancellation serves to reduce a net external magnetic flux incident on the system.

The aperture can be configured to have a ring shape substantially surrounding the profile of the internal shielding barrier as shadowed on the apertured wall. The aperture desirably has a diameter (or other cross dimension) greater than the corresponding width of the profile of the internal shielding barrier.

The apertured wall further can comprise at least one thickening member extending around an edge of the aperture. The thickening member serves to increase the thickness of magnetically permeable material adjacent the aperture, relative to the thickness of the magnetically permeable material in the apertured wall.

The aperture can be surrounded by a peripheral region defined from the apertured wall. In this configuration the peripheral region desirably comprises a magnetically permeable material having a magnetic permeability that is greater than the magnetic permeability of the magnetically permeable material of the wall.

According to another aspect of the invention, magnetically shielded enclosures are provided for containing and magnetically shielding a field-sensitive system. An embodiment of such an enclosure comprises an internal shielding barrier substantially surrounding the system, wherein the internal shielding barrier is made of a material including a magnetically permeable material. The enclosure also includes an outer magnetically shielded enclosure substantially surrounding the internal shielding barrier. The outer enclosure comprises: (a) multiple walls made of a material including a magnetically permeable material, wherein the walls are configured relative to each other so as to define an internal magnetically shielded space containing the internal shielding barrier, and (b) an aperture defined in at least one of the walls. The aperture is configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space. The cancellation serves to reduce a net external magnetic flux incident on the system.

In this enclosure the field-sensitive system can be, for example, a charged-particle-beam microlithography system. With such a system, the internal shielding barrier can be configured collectively as a lens column and substrate chamber of the system.

According to another aspect of the invention, methods are provided for magnetically shielding a field-sensitive system substantially surrounded by an internal shielding barrier. In an embodiment of such a method one step involves configuring multiple walls so as to define an internal magnetically shielded space, wherein each wall is made of a material including a magnetically permeable material. Another step involves situating the system, surrounded by the internal shielding barrier, in the internal magnetically shielded space. Another step involves defining an aperture in at least one of the walls, wherein the aperture is configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space. The cancellation serves to reduce a net external magnetic flux incident on the system.

The step of defining the aperture can comprise configuring the aperture to have a ring shape substantially surrounding the profile of the internal shielding barrier as shadowed on the apertured wall. The diameter (or other cross dimension) of the aperture can be greater than the diameter or other cross-dimension of the internal shielding barrier.

The step of defining the aperture further can comprise extending at least one thickening member around an edge of the aperture, so as to increase the thickness of magnetically permeable material adjacent the aperture, relative to the thickness of the magnetically permeable material in the apertured wall. Alternatively, the aperture can be surrounded by a peripheral region of the apertured wall. In this alternative configuration the step of defining the aperture further can comprise providing the peripheral region with a magnetically permeable material having a magnetic permeability greater than the magnetic permeability of the wall material. In either of these configurations, magnetic flux entering the thickened or peripheral region from the aperture increase the proportion of the leaking flux directed toward the wall of the enclosure rather than toward the internal shielding barrier. In addition to or alternatively to performing a field-canceling role, the aperture can be situated and configured such that a combination of the first portion of the external magnetic flux leaking through the aperture into the internal magnetically shielded space and the second portion of the external magnetic flux leaking through the wall into the internal magnetically shielded space collectively are oriented in direction(s) in which the leaked flux penetrates the internal shielding barrier only poorly at best. This achieves the result of minimizing the stray magnetic flux that penetrates the internal shielding barrier to the system.

The foregoing and additional features and advantages of the invention will be more readily apparent from the following detailed description, which proceeds with reference to the accompanying drawings.

BRIEF DESCRIPTION OF THE DRAWINGS

FIGS. 1(A)–1(B) schematically depict the magnetic-shielding action of a shielded enclosure (e.g., room) according to a first representative embodiment, wherein

DETAILED DESCRIPTION

The invention is described below in the context of representative embodiments that are not intended to be limiting in any way.

Figure 1A:
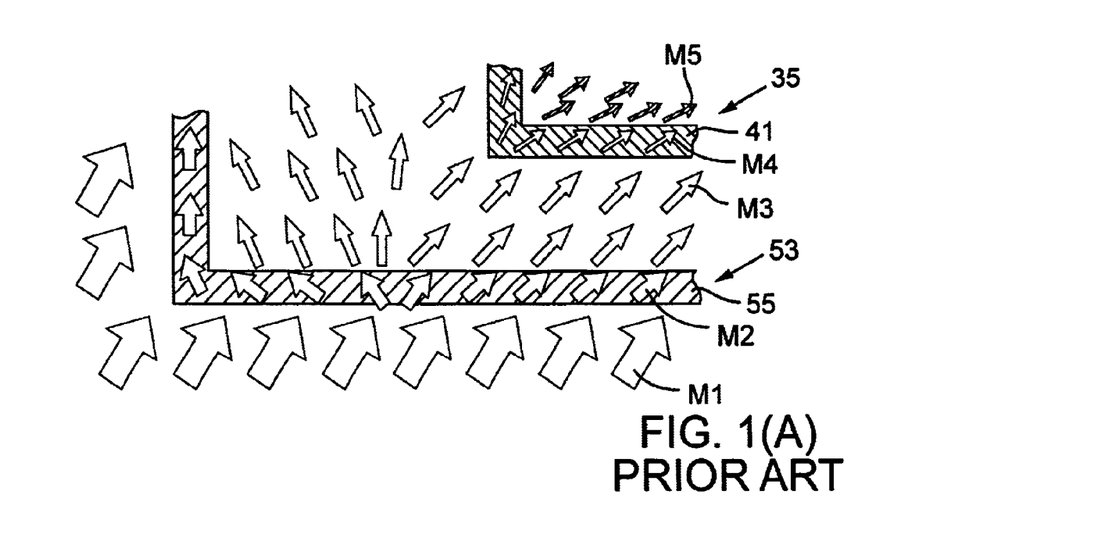
FIG. 1(A) is (for comparison purposes) an elevational section of a lower corner of a conventional shielded enclosure, with arrows indicating local directions and magnitudes of a stray external magnetic field penetrating into the enclosure.
Figure 1B:
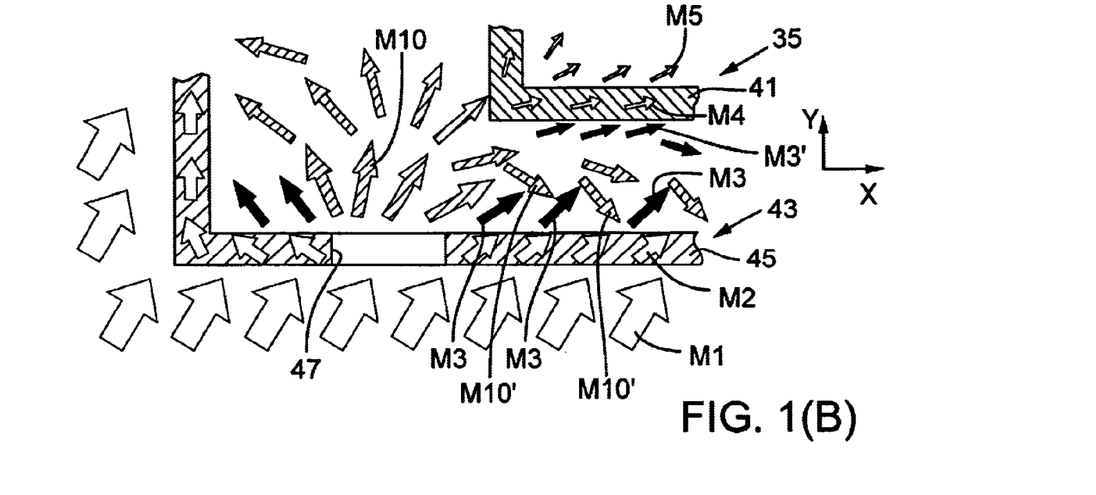
FIG. 1(B) is an elevational section of a lower corner of the shielded enclosure of the first representative embodiment, with said arrows.
Figure 2A:
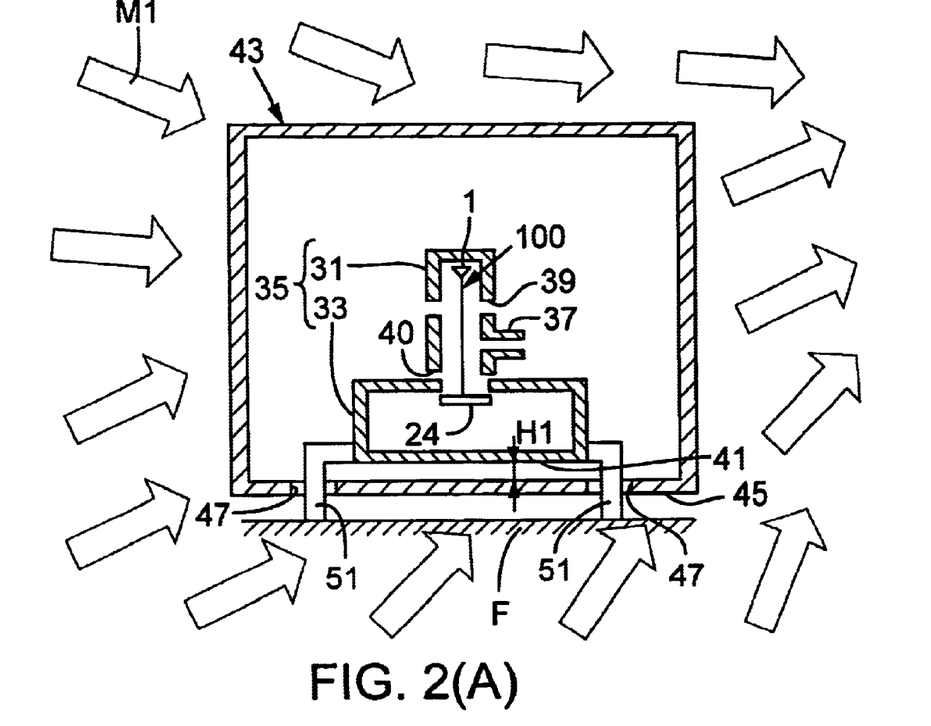
FIG. 2(A) is a schematic elevational section of a magnetically shielded enclosure, according to the first representative embodiment, containing a charged-particle-beam (CPB) microlithography system as an exemplary "field-sensitive" system.
Figure 2B:
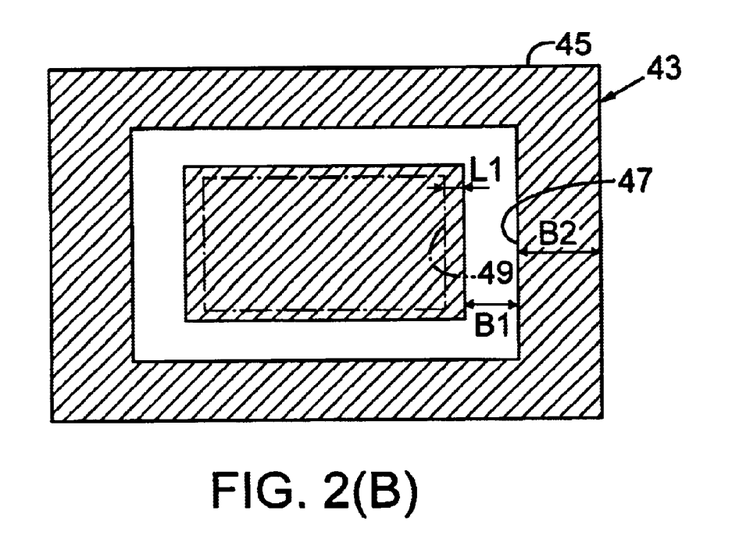
FIG. 2(B) is a "lower" orthogonal view of the enclosure shown in FIG. 2(A).
Figure 3:
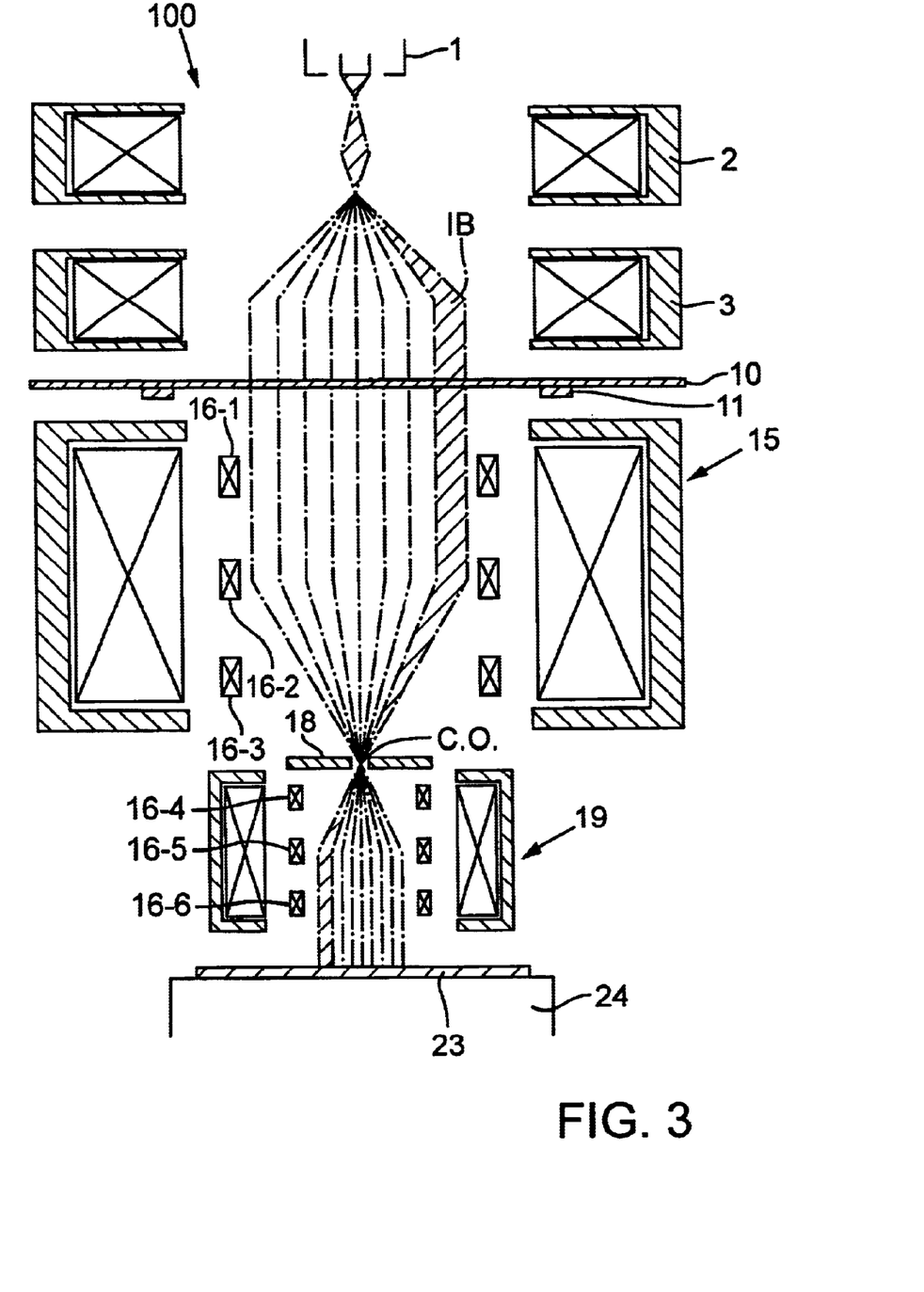
FIG. 3 is a schematic elevational section showing an exemplary configuration of the illumination-optical system and projection-optical system of the CPB microlithography system situated inside the enclosure of FIG. 2(A). Also shown are certain imaging relationships of the microlithography system.

A first representative embodiment is shown in FIGS. 1(A)–1(B), 2(A)–2(B), and 3. FIGS. 1(A)–1(B) schematically depict the magnetic-field-shielding action of a magnetically shielded enclosure (e.g., room) according to this embodiment. For comparison purposes, FIG. 1(A) shows the status of an exemplary stray magnetic field relative to a magnetically shielded enclosure 53 lacking a wall aperture (in the manner of a conventional shielded enclosure). FIG. 1(B) shows the status of an exemplary stray magnetic field relative to a shielded enclosure 43 including a wall aperture, according to the embodiment. FIGS. 2(A)–2(B) schematically depict the magnetically shielded enclosure 43 of FIG. 1(B) with a magnetic-field-sensitive lithography system 100 situated inside the enclosure, wherein FIG. 2(A) is a "front" elevational section of a corner of the enclosure, and FIG. 2(B) is an "underside" orthogonal view of the enclosure. FIG. 3 is a schematic elevational section of a microlithography system 100, showing certain details of the CPB optics and imaging relationships of the system. The depicted system 100 utilizes an electron beam as a representative charged particle beam. However, it will be understood that the general principles of the system as described below are applicable with equal facility to use of an alternative charged particle beam such as an ion beam.

Referring first to FIG. 3, an electron gun 1 is situated at the extreme upstream end of the depicted system 100. The electron gun 1 emits an electron beam that propagates in a downstream direction (downward in the figure, generally along an optical axis) toward a reticle 10. Typically of reticles used for charged-particle-beam (CPB) microlithography, the reticle 10 is divided into multiple regions, termed "subfields," each defining a respective portion of the pattern defined by the reticle, and is mounted on a reticle stage 11. The electron beam (termed an "illumination beam" IB upstream of the reticle 10) passes through a condenser lens 2 and an illumination lens 3 (constituting respective portions of an "illumination-optical system") and illuminates a selected region of a reticle 10. The illumination-optical system also includes other components such as a beam-shaping aperture, a blanking deflector, a blanking aperture, and a subfield-selection deflector (not shown). Thus, the illumination beam IB formed by the illumination-optical system is scanned over the reticle 10 so as to illuminate, in a sequential manner, the subfields of the reticle 10 situated in the optical field of the illumination-optical system.

The reticle 10 includes a far greater number of subfields than can be illuminated by the illumination-optical system at a given instant. To illuminate subfields situated outside the optical field of the illumination-optical system, the reticle stage 11 moves the reticle 10 as required, relative to the illumination-optical system, in a "reticle plane" or "object plane" extending perpendicularly to the optical axis of the system.

Passage of the illumination beam through the illuminated region of the reticle 10 causes the beam to acquire an aerial image of the respective pattern portion defined by the illuminated region. Hence, the beam propagating downstream of the reticle is termed a "patterned beam." Provided downstream of the reticle 10 is a "projection-optical system" comprising a first projection lens 15, a second projection lens 19, and deflectors 16 (note deflectors 16-1 to 16-6 in the figure). The deflectors 16 are used for aberration-correction and for making adjustments in image position on a downstream lithographic substrate 23. The patterned beam is focused by the projection lenses 15, 19 and deflector 16 at a predetermined location on the lithographic substrate 23 (e.g., semiconductor wafer). So as to be imprintable with the focused image, the substrate 23 is coated with an exposure-sensitive material termed a "resist." Typically, as a result of demagnification imparted by the projection-optical system, the image formed on the wafer is smaller (by an integer ratio such as ¼ or ⅕, termed the "demagnification ratio") than the corresponding illuminated region on the reticle 10.

A crossover C.O. is formed at a point on the optical axis situated, between the reticle 10 and wafer 23, as determined by the demagnification ratio. A contrast aperture 18 of the projection-optical system is provided at the location of the crossover C.O. The contrast aperture 18 blocks portions of the patterned beam that were scattered by passage of the illumination beam through non-patterned portions of the reticle 10. Thus, the scattered portions of the patterned beam are prevented from propagating to the substrate 23.

The substrate 23 is mounted on an electrostatic chuck on a substrate stage 24 that moves the substrate in an "imaging plane" or "substrate plane" that extends in the XY direction perpendicular to the optical axis. Exposure of the reticle subfields occurs in a sequential manner. To such end, the reticle subfields are arranged in multiple parallel rows each having a length equal to the width of the optical field of the illumination- and projection-optical systems. To expose the subfields sequentially in a particular row, the illumination beam is deflected laterally across the optical field (roughly in the X direction) as the patterned beam also is deflected laterally (roughly in the opposite X direction) to place the respective subfield images at desired respective locations on the substrate 23. To expose the rows sequentially, the reticle stage 11 and substrate stage 23 are moved in a synchronous, continuously scanning manner (in opposite Y directions). Thus, the subfield images are formed row-by-row on the substrate 23 in a manner such that the subfield images are "stitched" together in a contiguous manner.

Reference now is made to FIGS. 2(A)–2(B), depicting the magnetically shielded enclosure of this embodiment. In FIG. 2(A) only the electron gun 1, the beam trajectory, and the substrate stage 24 of the electron-beam microlithography system 100 of FIG. 3 are shown. The system 100 includes a lens column 31 containing the electron gun 1 and electron-optical system (illumination-optical system and projection-optical system) and a substrate chamber 33 containing the substrate stage 24 and peripheral components. The lens column 31 desirably is made of soft iron or invar, and includes a passive shield made of, e.g., Permalloy bonded to it (e.g., with a suitable adhesive). The substrate chamber 33 desirably is made of aluminum or non-magnetic stainless steel, and includes a passive shield made of, e.g., Permalloy bonded to it (e.g., with a suitable adhesive). The lens column 31 and substrate chamber 33 are connected together such that their interior spaces are contiguous.

The lens column 31 and substrate chamber 33 collectively form an "internal shielding barrier" 35. The internal shielding barrier 35 defines a vacuum duct 37 that is connected to a vacuum pump (not shown). The internal shielding barrier 35 also defines multiple apertures 39 as required for, e.g., insertion and removal of the reticle and substrate and for wiring feed-throughs. A gap 40 also may be present at the junction of the lens column 31 with the substrate chamber 33. The substrate chamber 33 has a "bottom" wall 41 having a width of, by way of example, 3 meters.

The internal shielding barrier 35 is enclosed inside a shielded space defined by the magnetically shielded enclosure 43. The enclosure 43 has walls 45 made of a material desirably comprising Permalloy B or analogous magnetically permeable material, and desirably has a height sufficient for allowing a suitable clearance above the top of the internal shielding barrier 35. The enclosure 43 also is sufficiently wide for accommodating the substrate chamber 33. The enclosure 43 has a "bottom" wall 45 having a width of, for example, 5 meters.

An aperture 47 ("ring"-shaped in this embodiment) is defined in the bottom wall 45 of the shield room 43, as shown in FIG. 2(B). As can be seen in the figure, the aperture 47 need not be round but desirably has a rectilinear profile or other profile desirably conforming to the general shape of the outline of the bottom wall 41 (see below) of the substrate chamber 33. The aperture 47 need not be an actual void in the wall 45, but rather can be a corresponding region of the wall having low initial permeability (e.g., a region lacking magnetically permeable material). Thus, the aperture 47 can be defined without compromising the strength or rigidity of the wall 45. Also, the aperture 47 need not be configured as a continuous ring. Alternatively, the aperture can be defined collectively by a series of discrete apertures arranged, for example, in a circle.

The aperture 47 desirably has an inside cross dimension greater than the width of a "shadow region" 49 (enclosed by the broken line in FIG. 2(B)) corresponding to the cross dimension of the bottom wall 41 of the substrate chamber 33. Desirably, a distance L1 (e.g., 20 to 30 cm) between the inner edge of the aperture 47 and the outer edge of the shadow region 49 is about ⅖ to ⅗ of a height dimension H1 (e.g., 50 cm) between the bottom wall 45 of the enclosure 43 and the bottom wall 41 of the internal shielding barrier 35. Thus, the aperture 47 desirably has a profile that conforms to the profile of the outer edge of the bottom wall 41 of the internal shielding barrier 35 (i.e., the bottom wall of the substrate chamber 33). Based on the other exemplary dimensions given above, the width B1 of the aperture 47 desirably is about 30 to 50 cm, and the distance B2 between the outer edge of the aperture 47 and the outer edge of the enclosure 43 desirably is 50 to 100 cm.

In any event, by providing the aperture 47 with a cross dimension greater than the cross dimension of the shadow region 49, stray external magnetic flux entering the enclosure via the aperture 47 tends to bend more toward the wall 45 than toward the internal shielding barrier 35, as discussed in detail below.

The substrate chamber 33 is supported relative to a "floor" F or other base surface by one or more legs 51 or analogous support members that extend through the aperture 47 outside the enclosure 43 to the floor F. Whereas the aperture 47 desirably accommodates the leg(s) 51, the aperture need not have a complete-ring shape, as noted above; rather, it can be defined as multiple spaced-apart apertures sized and spaced apart from each other sufficiently to accommodate respective leg(s) 51 extending therethrough.

The magnetic-shielding action of the enclosure 43 is explained with reference to FIGS. 1(A)–1(B), in which the large arrows have respective directions indicating the direction of respective portions of a stray magnetic flux. The respective sizes of the arrows denote relative magnitudes of the magnetic field at the respective locations.

If, as shown in FIG. 1(A), no aperture 47 were defined in the wall 45 of the enclosure 43, then respective portions of an external magnetic field M1 would permeate into the wall 45 of the enclosure 43. This magnetic flux permeating the wall is denoted M2. This permeating flux extends from the wall into the enclosure 43 as a "leakage" magnetic flux denoted M3. In general, the magnetic flux tends to flow toward regions having high magnetic permeability and to form a magnetic circuit with such regions. Hence, the permeating magnetic flux M2 and the leakage magnetic flux M3 are oriented toward the internal shielding barrier 35 in regions that are near the internal shielding barrier 35, but curve back toward the wall 55 of the enclosure 53 in regions that are distant from the internal shielding barrier 35. Hence, in the configuration of FIG. 1(A), the closer the internal shielding barrier 35 to a wall (side wall or bottom wall 55) of the enclosure 53, the greater the proportion of leakage magnetic flux M3 oriented toward the internal shielding barrier 35.

The leakage magnetic flux M3 oriented toward the internal shielding barrier 35 permeates and passes through the wall 41 of the internal shielding barrier 35 (the permeating flux is denoted M4, and flux transmitted through the wall 41 is denoted M5). The transmitted flux M5 can perturb the magnetic fields of the electron-optical system and in the region of the substrate situated inside within the lens column and substrate chamber, respectively, defined by the internal shielding barrier 35.

Note that the magnitude (strength) of the magnetic flux decreases as the flux progresses from outside the internal shielding barrier 35 to inside the space defined by the internal shielding barrier.

In contrast to the configuration shown in FIG. 1(A), the magnetically shielded enclosure room shown in FIG. 1(B) defines an aperture 47, as described above with reference to FIG. 2(B), in the bottom wall 45 of the enclosure 43. An external magnetic field M1, as in FIG. 1(A), permeates the wall 45 and passes into the enclosure 43. The external magnetic field M1 also enters the enclosure 43 through the aperture 47 (the magnetic flux passing through the wall 45 is denoted M2, the flux transmitted through the wall 45 is denoted M3, and the flux passing through the aperture 47 is denoted M10). The magnitude of the flux M10 passing through the aperture 47 is greater than the flux M3 leaking through the wall 45. As described above, the aperture 47 is defined so as to be larger than the "shadow" of the bottom wall 41 of the internal shielding barrier 35 as projected on the bottom wall 45 of the enclosure 43. Consequently, it is difficult for the magnetic flux M10 passing through the aperture 47 to enter the surface of the bottom wall 41 in a perpendicular manner. Whereas some of the magnetic flux M10 passing through the aperture 47 bends toward the internal shielding barrier 35, most of the flux M10 bends back into the wall of the enclosure 43 (this bending-back flux is denoted M10').

Hence, both the magnetic flux M10' and the magnetic flux M3 are present inside the space defined between the enclosure 43 and the internal shielding barrier 35. In FIG. 1(B) the respective Y-direction components of the fluxes M10', M3 tend to cancel each other, leaving mainly an X-direction component. The X-direction component has a direction essentially parallel to the bottom wall 41 of the internal shielding barrier 35. As a result, a reduced amount (compared to FIG. 1(A)) of the leakage magnetic flux M3 is directed toward the internal shielding barrier 35 (the small amount of the flux M3 actually reaching the internal shielding barrier 35 is denoted M3'). Thus, the magnitude of the leakage magnetic flux M3 oriented toward the internal shielding barrier 35 is reduced significantly by the magnetic flux M10', and the direction of the magnetic flux M3 is changed, which reduces the magnetic flux M4 permeating the internal shielding wall 35, and correspondingly reduces the leakage magnetic flux M5 passing through the bottom wall 41.

In the enclosure 43 the height of pedestals (not shown) used for attenuation of vibrations of the microlithography system 100 need not be great. Also, the bottom wall 41 of the internal shielding barrier 35 need not be distant from the bottom wall 45 of the enclosure 43. The legs 51, attached to the wafer chamber 33, support the microlithography system 100 (and internal shielding barrier 35) relative to the floor F, thereby avoiding imposition of a substantial mechanical load on the bottom wall 45 of the enclosure 43. Normally, Permalloy, which is the desired magnetically permeable material for use in making the walls of the enclosure 43, needs to be magnetically annealed because it tends to lose its magnetic characteristics if mechanically stressed. But, in this representative embodiment, magnetic annealing of the enclosure 43 is unnecessary because it receives no significant mechanical stress. Also, the enclosure 43 need not be excessively large, which provides better shielding with smaller and less massive walls 45.

When manufacturing a shielded enclosure according to this embodiment, the respective locations of apertures (provided for inserting and removing reticles and substrates, for example) can be established at locations of joints in the shield material. As a result, the number of joints can be reduced and construction correspondingly simplified, compared to the configuration in FIG. 6.

The magnitudes of magnetic fields in the shielded enclosure of this embodiment were determined by computer simulation. The simulation results indicated a 4- to 5-fold improvement in magnetic shielding, compared to conventional enclosures lacking the aperture 47. In addition, the amount of material required to fabricate the shielded enclosure was reduced by approximately 20% compared to conventional enclosures lacking the aperture 47.

Figure 4:
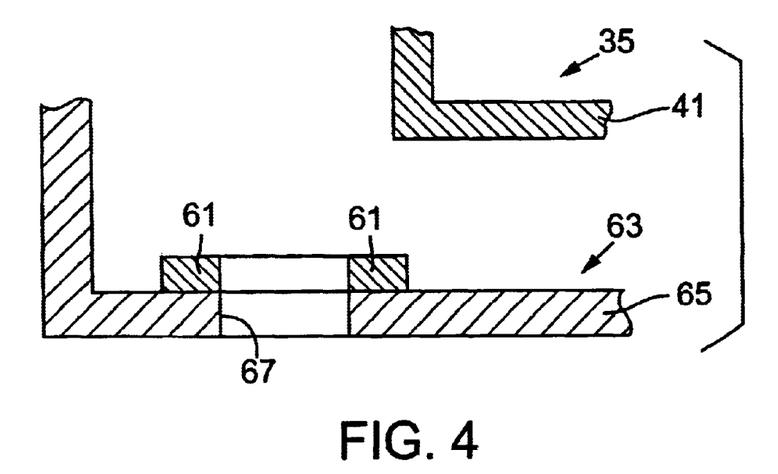
FIG. 4 is an elevational section of a "lower" corner of a magnetically shielded enclosure according to a second representative embodiment.

A partial sectional view of a magnetically shielded enclosure 63 according to a second representative embodiment is shown in FIG. 4. In the enclosure 63 the thickness of magnetically permeable material around the aperture 67 defined in the bottom wall 65 is increased relative to the normal thickness of the magnetically permeable material in the wall 65 itself. By way of example, thickening members 61 are provided, each having a thickness approximately 2 to 3 times greater than the normal thickness of the wall 65 (which, in one example, is 0.5 to 1 mm). Each thickening member 61 can be formed by layering additional shielding material on the magnetically permeable material of the wall 65 at the outer and inner periphery of the aperture 67.

Whenever the thickness of magnetically permeable material around the aperture 67 is increased in this manner, the magnetic flux entering through the aperture 67 is attracted easily to the thick portion 51, which further increases the proportion of the entering magnetic-flux component that bends toward the wall 65 of the enclosure 63. Thus, more of the leakage magnetic flux is effectively cancelled.

Figure 5:
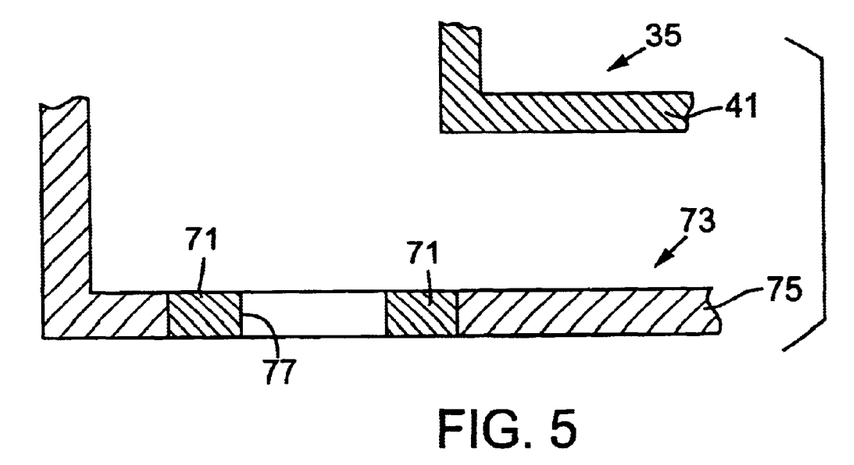
FIG. 5 is an elevational section of a "lower" corner of a magnetically shielded enclosure according to a third representative embodiment.

A partial sectional view of a magnetically shielded enclosure 73 according to a third representative embodiment is shown in FIG. 5. In the enclosure 73 a portion 71 of the wall 75 surrounding the aperture 77 is made of a magnetic material having a higher magnetic permeability than the magnetic shielding material in the wall 75. An exemplary material for the higher-permeability portion 71 is Permalloy C. The maximum magnetic permeability ($\mu_m$) of Permalloy B used for the magnetically permeable material of the walls 75 is about 40,000 to 80,000, whereas the maximum permeability of Permalloy C is about 100,000 to 200,000.

By configuring the higher-permeable region 71 with such high magnetic permeability, magnetic flux passing through the aperture 77 is attracted easily to the region 71, which increases the proportion of the transmitted magnetic flux that bends back toward the wall 75 of the enclosure, thereby producing the same effect as in the embodiment of FIG. 4.

As is clear from the foregoing, superior magnetic shielding in an enclosure is achieved without having to configure the enclosure excessively large compared to field-sensitive system contained in such an enclosure. Also, improved magnetic shielding is achieved using less magnetically permeable material, while providing an enclosure that is easy to configure and construct. Also provided is improved performance of a microlithography system contained inside the enclosure.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A magnetically shielded enclosure for containing and magnetically shielding a field-sensitive system, the system including an internal shielding barrier substantially surrounding the system, the enclosure comprising:

multiple walls made of a material including a magnetically permeable material, the walls being configured relative to each other so as to define an internal magnetically shielded space that encloses the internal shielding barrier; and an aperture defined in at least one of the walls, the aperture being configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space, the cancellation serving to reduce a net external magnetic flux incident on the system.

2. The enclosure of claim 1, wherein the aperture is configured to have a ring shape substantially surrounding the profile of the internal shielding barrier as shadowed on the apertured wall.

3. The enclosure of claim 1, wherein the aperture has a diameter greater than the profile of the internal shielding barrier.

4. The enclosure of claim 1, wherein:

the magnetically permeable material of the apertured wall has a thickness; and the apertured wall further comprises at least one thickening member extending around an edge of the aperture, the thickening member serving to increase the thickness of magnetically permeable material adjacent the aperture, relative to the thickness of the magnetically permeable material in the apertured wall.

5. The enclosure of claim 1, wherein:

the magnetically permeable material of the apertured wall has a first magnetic permeability;

the aperture is surrounded by a peripheral region of the apertured wall; and the peripheral region comprises a magnetically permeable material having a second magnetic permeability that is greater than the first magnetic permeability.

6. A field-sensitive system, comprising and contained in a magnetically shielded enclosure as recited in claim 1.

7. The field-sensitive system of claim 6, configured as a charged-particle-beam microlithography system.

8. A magnetically shielded enclosure for containing and magnetically shielding a field-sensitive system, the system including an internal shielding barrier substantially surrounding the system, the enclosure comprising:

multiple walls made of a material including a magnetically permeable material, the walls being configured relative to each other so as to define an internal magnetically shielded space that encloses the internal shielding barrier; and an aperture defined in at least one of the walls, the aperture being configured relative to a profile of the internal shielding barrier as shadowed on the apertured wall such that a combination of a first portion of an external magnetic flux leaking through the aperture into the internal magnetically shielded space and a second portion of the external magnetic flux leaking through the wall into the internal magnetically shielded space enter the internal shielding barrier with greater difficulty than otherwise if the aperture were not defined, thereby reducing a net external magnetic flux passing to the system.

9. A field-sensitive system, comprising and contained in a magnetically shielded enclosure as recited in claim 8.

10. The field-sensitive system of claim 9, configured as a charged-particle-beam microlithography system.

11. A magnetically shielded enclosure for containing and magnetically shielding a field-sensitive system, the enclosure comprising:

an internal shielding barrier substantially surrounding the system, the internal shielding barrier being made of a material including a magnetically permeable material; and an outer magnetically shielded enclosure substantially surrounding the internal shielding barrier, the outer enclosure comprising (a) multiple walls made of a material including a magnetically permeable material, the walls being configured relative to each other so as to define an internal magnetically shielded space containing the internal shielding barrier, and (b) an aperture defined in at least one of the walls, the aperture being configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space, the cancellation serving to reduce a net external magnetic flux incident on the system.

12. The enclosure of claim 11, wherein:

the field-sensitive system is a charged-particle-beam microlithography system; and the internal shielding barrier is configured collectively as a lens column and substrate chamber of the system.

13. The enclosure of claim 11, wherein the aperture is configured to have a ring shape substantially surrounding the profile of the internal shielding barrier as shadowed on the apertured wall.

14. The enclosure of claim 11, wherein the aperture has a diameter greater than the profile of the internal shielding barrier.

15. The enclosure of claim 11, wherein:

the magnetically permeable material of the apertured wall has a thickness; and the apertured wall further comprises at least one thickening member extending around an edge of the aperture, the thickening member serving to increase the thickness of magnetically permeable material adjacent the aperture, relative to the thickness of the magnetically permeable material in the apertured wall.

16. The enclosure of claim 11, wherein:

the magnetically permeable material of the apertured wall has a first magnetic permeability;

the aperture is surrounded by a peripheral region of the apertured wall; and the peripheral region comprises a magnetically permeable material having a second magnetic permeability that is greater than the first magnetic permeability.

17. A field-sensitive system, comprising and contained in a magnetically shielded enclosure as recited in claim 11.

18. The field-sensitive system of claim 17, configured as a charged-particle-beam microlithography system.

19. A method for magnetically shielding a field-sensitive system substantially surrounded by an internal shielding barrier, the method comprising:

configuring multiple walls so as to define an internal magnetically shielded space, each wall being made of a material including a magnetically permeable material;

situating the system, surrounded by the internal shielding barrier, in the internal magnetically shielded space; and defining an aperture in at least one of the walls, the aperture being configured relative to a profile of the internal shielding barrier as shadowed on the apertured wall such that a first portion of an external magnetic flux leaking through the aperture into the internal magnetically shielded space at least partially cancels a second portion of the external magnetic flux leaking through the wall into the internal magnetically shielded space, the cancellation serving to reduce a net external magnetic flux incident on the system.

20. The method of claim 19, wherein the step of defining the aperture comprises configuring the aperture to have a ring shape substantially surrounding the profile of the internal shielding barrier as shadowed on the apertured wall.

21. The method of claim 19, wherein the step of defining the aperture comprises providing the aperture with a diameter greater than the profile of the internal shielding barrier.

22. The method of claim 19, wherein:

the magnetically permeable material of the apertured wall has a thickness; and the step of defining the aperture further comprises extending at least one thickening member around an edge of the aperture, so as to increase the thickness of magnetically permeable material adjacent the aperture, relative to the thickness of the magnetically permeable material in the apertured wall.

23. The method of claim 19, wherein:

the magnetically permeable material of the apertured wall has a first magnetic permeability;

the aperture is surrounded by a peripheral region of the apertured wall; and the step of defining the aperture further comprises providing the peripheral region with a magnetically permeable material having a second magnetic permeability that is greater than the first magnetic permeability.

24. The method of claim 19, further comprising the step of supporting the system, relative to a base surface, by at least one leg extending through the aperture to the base surface.

25. A field-sensitive system that is magnetically shielded by a method as recited in claim 19.

26. The system of claim 25, configured as a charged-particle-beam microlithography system.

* * * * *

UNITED STATES PATENT AND TRADEMARK OFFICE
CERTIFICATE OF CORRECTION

PATENT NO. : 6,670,547 B2
DATED : December 30, 2003
INVENTOR(S) : Kageyama

It is certified that error appears in the above-identified patent and that said Letters Patent is hereby corrected as shown below:

Column 3,
Line 15, "generated from by the coil(s)" should read -- generated by the coil(s) --.

Column 11,
Line 40, "to field-sensitive" should read -- to a field-sensitive --.

Signed and Sealed this

Fifth Day of April, 2005

JON W. DUDAS
*Director of the United States Patent and Trademark Office*